United States Patent
Dalrymple et al.

(10) Patent No.: US 11,156,827 B2
(45) Date of Patent: Oct. 26, 2021

(54) BUCKLING MODE ACTUATION OF FIBER SCANNER TO INCREASE FIELD OF VIEW

(71) Applicant: Magic Leap, Inc., Plantation, FL (US)

(72) Inventors: Timothy Mark Dalrymple, Gainesville, FL (US); Andrew C. Duenner, Houston, TX (US); Albert Daniel Carlomagno, Hollywood, FL (US); Xiaoyang Zhang, Alviso, CA (US); Michael Robert Johnson, Plantation, FL (US); William K. Jones, Jr., Fort Lauderdale, FL (US); Charles David Melville, Camano Island, WA (US)

(73) Assignee: Magic Leap, Inc., Plantation, FL (US)

( * ) Notice: Subject to any disclaimer, the term of this patent is extended or adjusted under 35 U.S.C. 154(b) by 0 days.

(21) Appl. No.: 16/878,525

(22) Filed: May 19, 2020

(65) Prior Publication Data

US 2020/0278535 A1    Sep. 3, 2020

Related U.S. Application Data

(63) Continuation of application No. 16/511,956, filed on Jul. 15, 2019, now Pat. No. 10,718,941, which is a
(Continued)

(51) Int. Cl.
*G02B 26/10* (2006.01)
*H04N 9/14* (2006.01)
(Continued)

(52) U.S. Cl.
CPC .......... *G02B 26/103* (2013.01); *H01L 41/042* (2013.01); *H01L 41/047* (2013.01);
(Continued)

(58) Field of Classification Search
None
See application file for complete search history.

(56) References Cited

U.S. PATENT DOCUMENTS 9,561,078 B2 * 2/2017 Seibel ...................... A61B 1/07
10,422,991 B2 * 9/2019 Dalrymple ........... G02B 26/103
(Continued)

FOREIGN PATENT DOCUMENTS

| JP | 2009501960 A | 1/2009 |
| JP | 2010097083 A | 4/2010 |
| WO | 2016075777 A1 | 5/2016 |

OTHER PUBLICATIONS

EP18781690.5, "Office Action", dated Jul. 28, 2021, 6 pages.
JP2019-554526, "Office Action", English Translation, dated May 14, 2021, 4 pages.

*Primary Examiner* — Tina M Wong
(74) *Attorney, Agent, or Firm* — Kilpatrick Townsend & Stockton LLP

(57) ABSTRACT

Described herein are embodiments of fiber scanning systems and methods of scanning optical fibers. The disclosed systems and methods advantageously provide an improvement to the scanning range, the oscillation amplitude, and/or the maximum pointing angle for an optical fiber in a fiber scanning system by inducing a buckling of a portion of the optical fiber.

20 Claims, 9 Drawing Sheets

Related U.S. Application Data continuation of application No. 15/944,390, filed on Apr. 3, 2018, now Pat. No. 10,422,991.

(60) Provisional application No. 62/481,497, filed on Apr. 4, 2017.

(51) Int. Cl.
  *H01L 41/04* (2006.01)
  *H01L 41/09* (2006.01)
  *H01L 41/047* (2006.01)
  *H04N 9/31* (2006.01)
  *H02N 2/00* (2006.01)

(52) U.S. Cl.
  CPC ............. *H01L 41/092* (2013.01); *H04N 9/14* (2013.01); *H02N 2/0075* (2013.01); *H04N 9/3179* (2013.01)

(56) References Cited

U.S. PATENT DOCUMENTS

| | | | |
|---|---|---|---|
| 10,718,941 B2* | 7/2020 | Dalrymple | H01L 41/047 |
| 2016/0022373 A1* | 1/2016 | Valsamis | G01L 5/166 |
| | | | 600/424 |
| 2020/0278535 A1* | 9/2020 | Dalrymple | H01L 41/092 |

* cited by examiner

BUCKLING MODE ACTUATION OF FIBER SCANNER TO INCREASE FIELD OF VIEW

CROSS-REFERENCE TO RELATED APPLICATIONS

This application is a continuation of U.S. patent application Ser. No. 16/511,956, filed Jul. 15, 2019, entitled "BUCKLING MODE ACTUATION OF FIBER SCANNER TO INCREASE FIELD OF VIEW," which is a continuation of U.S. patent application Ser. No. 15/944,390, filed Apr. 3, 2018, now U.S. Pat. No. 10,422,991, issued Sep. 24, 2019, entitled "BUCKLING MODE ACTUATION OF FIBER SCANNER TO INCREASE FIELD OF VIEW," which is a non-provisional of and claims the benefit of and priority to U.S. Provisional Application No. 62/481,497, filed on Apr. 4, 2017, entitled "BUCKLING MODE ACTUATION OF FIBER SCANNER TO INCREASE FIELD OF VIEW," which are hereby incorporated by reference in their entireties for all purposes.

BACKGROUND

Scanning devices typically trade off scanning range for frequency. In general, as frequency is increased, scanning range decreases, and as frequency decreases, scanning range can be increased. In some applications, however, it is desirable to increase both frequency and scanning range. Additional scanning system designs are needed to improve and expand the scanning range and utility of scanning systems.

SUMMARY

This application relates to optical fiber scanner systems and related methods. More specifically, and without limitation, this application relates to optical fiber oscillators, such as used for scanning fiber displays, where the optical fibers are oscillated in a whirling motion by way of a mechanical actuator, such as a piezoelectric actuator (piezo). The optical fibers are further induced to buckle by application of a compressive force, where the buckling increases a maximum deflection of the optical fiber, which may increase the field of view of the system. The combination of buckling and whirling, in embodiments, can provide a useful increase in field of view, as compared to whirling only systems, without sacrificing size, form factor, or frequency.

In optical scanning systems, frequency may be important for both resolution and refresh rate, and two distinct frequency regimes may be useful to consider. For example, in a scanning fiber display, a first frequency may be related to the refresh rate, where repeated scans of a fiber may dictate how frequently the output view can be changed. A second frequency regime may be related to the individual oscillations within a single scan, and this frequency may impact the resolution by dictating how fine the distinctions between non-overlapping motions of the fiber can be and how quickly these motions can be made within a single scan of the fiber.

Range, however, may be important for field-of-view for a given projector design. For example, the maximum amplitude or range of an oscillating fiber may provide for a limit on how wide an output image generated by the fiber may be. As the oscillation range is increased, a wider field of view may be provided.

Scanning devices may be useful as display devices due to their small form factor and useful resolution and field-of-view. However, in order to obtain high frequency scanning devices with a high scanning range, innovations in this field are required. The presently described optical fiber scanning systems allow for improved field-of-view projectors while maintaining a small form factor. As an example, by incorporating the disclosed scanning systems into a scanning fiber display projector, the field-of-view of the projector may be increased relative to conventional scanning fiber display devices.

Without limitation, the present application provides devices and systems, such as optical fiber scanning devices or systems that comprise an optical fiber. In an aspect, an optical fiber scanning system comprises an optical fiber having a distal fiber end and a proximal fiber end; a first electromechanical transducer mechanically coupled to the optical fiber between the distal fiber end and the proximal fiber end, such as a first electromechanical transducer that is configured to apply a buckling force to the optical fiber; and a second electromechanical transducer mechanically coupled to the optical fiber between the distal fiber end and the proximal fiber end, such as a second electromechanical transducer that is configured to excite whirling of the distal fiber end. In embodiments, the distal fiber end is unconstrained, which may allow the distal fiber end to deflect laterally in response to mechanical actuation.

Optionally, a first joint mechanically coupling the first electromechanical transducer and the optical fiber has a first axial stiffness along an axis parallel to a longitudinal axis of the optical fiber. Optionally, a second joint mechanically coupling the second electromechanical transducer and the optical fiber has a second axial stiffness along the axis parallel to the longitudinal axis of the optical fiber. In embodiments, the first axial stiffness and the second axial stiffness are sufficient to induce buckling of the optical fiber when a distance between the first joint and the second joint is reduced by a particular distance, such as a minimum distance less than 5 µm, by a distance of between 1 µm and 5 µm, or by greater distances, such as between 1 µm and 50 µm, between 5 µm and 10 µm, between 10 µm and 20 µm, between 20 m and 30 µm, between 40 µm and 50 µm, or more than 50 µm.

Various configurations for the first electromechanical transducer and the second electromechanical transducers are useful with the optical fiber scanning systems described herein. For example, the first electromechanical transducer optionally corresponds to a buckling piezo having a distal buckling end and a proximal buckling end. The optical fiber may be mechanically coupled to the distal buckling end, the proximal buckling end, or both the distal buckling end and the proximal buckling end. In embodiments, the buckling piezo is a piezo tube or piezo stack. Optionally, the optical fiber passes through the piezo tube or the piezo stack. The buckling piezo may include a plurality of electrodes for controlling a length of the buckling piezo by application of one or more voltages. For example, reducing a length of the buckling piezo between the distal buckling end and the proximal buckling end applies the buckling force to the optical fiber.

In another example, the second electromechanical transducer corresponds to a piezo tube, such as a whirling piezo tube, having a distal tube end and a proximal tube end. In embodiments, the optical fiber passes through the whirling piezo tube. The distal tube end may be mechanically coupled to the optical fiber by a whirling distal joint. Optionally, the optical fiber is mechanically coupled to the distal tube end, the proximal tube end, or both the distal tube end and the proximal tube end, depending on the particular configuration used in the optical scanning system. Optionally, the distal fiber end extends beyond the distal tube end, and the distal tube end is positioned between the distal fiber end and the proximal tube end. In embodiments, the proximal fiber end extends beyond the proximal tube end and the proximal tube end is positioned between the proximal fiber end and the distal tube end. Optionally, the optical fiber is not fixed to the proximal tube end.

In embodiments, the whirling piezo tube includes a plurality of electrodes for controlling lateral deflections of a distal tube end of the piezo tube by application of one or more voltages, such as to induce whirling of the distal end of the optical fiber. In embodiments, the whirling piezo tube has an inner diameter sufficient to accommodate buckling of the optical fiber. The whirling distal joint may have an axial stiffness along a longitudinal axis of the whirling piezo tube, such as an axial stiffness that is sufficient to induce buckling of the optical fiber. The whirling distal joint may have a lateral stiffness that is sufficient to accommodate lateral rotation of the optical fiber during buckling.

In some embodiments, the optical fiber scanning system further comprises a support tube mechanically coupled to the whirling piezo tube and the first electromechanical transducer. Optionally the first electromechanical transducer is positioned inside the support tube. Optionally, the first electromechanical transducer corresponds to a buckling piezo tube, as described above, such as a buckling piezo tube having a distal buckling end and a proximal buckling end. In embodiments, the distal buckling end is positioned between the proximal tube end and the proximal buckling end. In some embodiments, the optical fiber and the distal buckling end are mechanically coupled by a buckling distal joint, and movement of the buckling distal joint along a longitudinal fiber axis causes buckling of the optical fiber between the buckling distal joint and the whirling distal joint. Optionally, the support tube has a distal end and a proximal end, such as a distal end of the that is mechanically coupled to the proximal tube end by a whirling proximal joint, and a proximal end that is mechanically coupled to the proximal buckling end by a buckling proximal joint.

In another example, the second electromechanical transducer includes a hub, a frame surrounding the hub, and a plurality of lateral electromechanical transducers mechanically coupled to the frame and to the hub. In some embodiments, the optical fiber passes through the hub and the hub is mechanically coupled to the optical fiber by a whirling joint. The second electromechanical transducer optionally includes a plurality of flexures extending radially from the hub and coupling the hub to the frame. The lateral electromechanical transducers may correspond to piezo elements including electrodes for controlling lateral deflections of the hub to excite whirling of the distal fiber end. For example, application of one or more voltages to the electrodes modifies a controls a length of the piezo elements. Optionally, the piezo elements may be actuated in sequence to move the whirling joint in a laterally rotating motion.

In another example, the first and second electromechanical transducers may be combined. For example, the first electromechanical transducer and the second electromechanical transducer may optionally comprise a piezo tube, such as a piezo tube that has a distal tube end and a proximal tube end. Optionally, the optical fiber passes through the piezo tube and the distal fiber end extends beyond the distal tube end. The distal tube end and the optical fiber may be mechanically coupled at a distal joint. The proximal tube end and the optical fiber may be mechanically coupled at a proximal joint. In some embodiments, the distal joint and the proximal joint have axial stiffnesses along a longitudinal axis of the piezo tube that are sufficient to induce buckling of the optical fiber, such as when a length of the piezo tube is reduced. Optionally, the distal joint has a lateral stiffness that is sufficient to accommodate lateral rotation of the optical fiber during buckling. In embodiments, the piezo tube has an inner diameter sufficient to accommodate buckling of the optical fiber between the distal joint and the proximal joint. In embodiments, the distal tube end is positioned between the distal fiber end and the proximal tube end, the proximal fiber end extends beyond the proximal tube end, and the proximal tube end is positioned between the proximal fiber end and the distal tube end.

In embodiments, the piezo tube includes a plurality of electrodes for controlling lateral deflections of a distal tube end of the piezo tube end and for controlling a length of the piezo tube, such as by application of one or more voltages. Optionally, voltages may be superimposed on one another to induce simultaneous buckling and whirling. For example, a buckling voltage may be simultaneously applied to each of the plurality of electrodes to cause a length of the piezo tube along a longitudinal tube axis to change, and different whirling voltages applied individually to the plurality of electrodes to cause the distal tube end to deflect laterally, such as in a spiral configuration.

In a specific embodiment, an optical fiber scanning system comprises a first electromechanical transducer mechanically coupled to the optical fiber, such as a first electromechanical transducer that is configured to apply a buckling force to the optical fiber; and a second electromechanical transducer mechanically coupled to the optical fiber, such as a second electromechanical transducer that configured to excite whirling of the optical fiber.

It will be appreciated that the whirling and buckling motions may combine to increase a field of view of an optical fiber scanner beyond that available from a whirling-only fiber scanner. Optionally, the buckling force periodically ramps in amplitude. Optionally, a whirling amplitude of the fiber periodically ramps. Optionally, ramping of the buckling force and ramping of the whirling amplitude are synchronized. Optionally, piezos may be used as the electromechanical transducers, as described above.

For example, an optical fiber scanning system may comprise a piezo tube; an optical fiber passing through the piezo tube; a support tube mechanically coupled to the piezo tube; and a buckling piezo disposed inside the support tube and mechanically coupled to the optical fiber. It will be appreciated that the optical fiber may also pass through an interior space defined by the buckling piezo.

It will be appreciated that a variety of piezo tubes are useful with the disclosed optical fiber scanning systems and devices and methods. For example, a piezo tube may optionally comprise a radially poled piezoelectric tube. Optionally, a piezo tube may comprise a piezo stack. A piezo tube may have an inner diameter of a dimension sufficient to accommodate buckling of the optical fiber, such as an inner diameter that is greater than an outer diameter of the optical fiber. Such differences in diameters may allow the optical fiber to buckle inside of the piezo tube without contacting an inner surface of the piezo tube.

In various embodiments, the piezo tube has a distal tube end and a proximal tube end. It will be appreciated that the terms distal and proximal are relative terms referencing different positions or ends of a component. For example, the optical fiber has a distal fiber end and a proximal fiber end. The distal fiber end of the optical fiber may extend distally beyond a distal tube end of the piezo tube. For example, the distal tube end of the piezo tube may be positioned between the distal fiber end of the optical fiber and a proximal tube end of the piezo tube. The proximal fiber end of the optical fiber may extend proximally beyond a proximal tube end of the piezo tube. For example, the proximal tube end of the piezo tube may be positioned between the proximal fiber end of the optical fiber and the distal tube end of the piezo tube. In embodiments, the distal fiber end of the optical fiber is unconstrained. Optionally, the optical fiber is not fixed to the proximal tube end.

Various optical fibers are useful with the disclosed optical fiber scanning systems and devices and methods. For example, the optical fiber optionally comprises one or more of a cladding, one or more cores, a single-mode optical fiber, a multi-mode optical fiber, a step-index optical fiber, a photonic crystal optical fiber, a visible optical waveguide, an infrared optical waveguide, an ultraviolet optical waveguide, and a plurality of optical fibers.

In order to achieve buckling of the optical fiber, various components may be mechanically coupled to one another. For example, the optical fiber and a distal tube end of the piezo tube may be mechanically coupled by a whirling distal joint. As used herein, "whirling distal joint" and "distal whirling joint" may be used interchangeably. It will be appreciated that the whirling distal joint may have an axial stiffness along the tube axis that is sufficient to induce buckling of the optical fiber. Optionally, the whirling distal joint has a lateral stiffness that is sufficient to accommodate lateral rotation of the optical fiber during buckling. In some embodiments, the whirling distal joint has an axial stiffness along the tube axis that is sufficient to induce buckling of the optical fiber when a distance between the whirling distal joint and a buckling distal joint is reduced by a threshold amount or more, such as a threshold amount less than about 5 µm, such as between about 0.01 µm and about 5 µm or between about 0.1 µm and about 5 µm.

Additionally or alternatively, the buckling distal joint mechanically couples the optical fiber and the buckling piezo. As used herein, "buckling distal joint" and "distal buckling joint" may be used interchangeably. In embodiments, the buckling piezo has a distal piezo end and a proximal piezo end. For example, the distal piezo end of the buckling piezo is positioned between a proximal tube end of the piezo tube and the proximal piezo end of the buckling piezo. Optionally, the optical fiber and the distal piezo end of the buckling piezo are mechanically coupled by a buckling distal joint. For example, movement of the buckling distal joint along a fiber axis may cause buckling of the optical fiber between the buckling distal joint and a whirling distal joint.

Various configurations are contemplated for the buckling piezos used with the systems, devices and methods described herein. For example, the buckling piezo optionally comprises a second piezo tube. Optionally, the buckling piezo comprises a piezo stack.

To achieve whirling motion, application of voltages to a piezo tube may be used to change a dimensional characteristic of the piezo tube. For example, the piezo tube may include a plurality of electrodes, such as for controlling lateral deflections of a distal tube end of the piezo tube by application of one or more voltages. Optionally, the plurality of electrodes includes a first pair of electrodes extending along a length of the piezo tube and arranged 180° from one another. Optionally, the plurality of electrodes includes a second pair electrodes extending along the length of the piezo tube and arranged 180° from one another and 90° from the first pair of electrodes. Optionally, an inner surface of the piezo tube provides a voltage ground for the plurality of electrodes.

To achieve buckling motion, application of voltages to a buckling piezo may be used to change a dimensional characteristic of the buckling piezo. For example, the buckling piezo may include a plurality of electrodes, such as for controlling a length of the buckling piezo by application of one or more voltages.

Application of voltages to a piezo element may be achieved by use of one or more voltage sources. For example, an optical fiber scanning system may further comprise a voltage source in electrical communication with the plurality of electrodes of a piezo tube, such as a voltage source that applies one or more whirling voltages to the plurality of electrodes. Example whirling voltages have a frequency of between about 10 kHz and about 80 kHz. Alternatively or additionally, an optical fiber scanning system may further comprise a voltage source in electrical communication with the plurality of electrodes of a buckling piezo, such as a voltage source that applies a buckling voltage to the plurality of electrodes. Example buckling voltage may have a frequency or repetition rate of between about 15 Hz and about 300 Hz.

In embodiments including a support tube, the support tube may have a distal end and a proximal end. For example, the distal end of the support tube and a proximal tube end of the piezo tube may be mechanically coupled by a whirling proximal joint. As used herein, "whirling proximal joint" and "proximal whirling joint" may be used interchangeably. The proximal end of the support tube and a proximal piezo end of the buckling piezo may be mechanically coupled by a buckling proximal joint. As used herein, "buckling proximal joint" and "proximal buckling joint" may be used interchangeably.

Different optical fiber scanning system configurations are contemplated, which may include one or more of the features described above. For example, an optical fiber scanning system may comprise a piezo tube, such as a piezo tube that has a tube axis, one or more lateral axes, a distal tube end, and a proximal tube end; an optical fiber passing through the piezo tube; a distal joint mechanically coupling the distal tube end of the piezo tube and the optical fiber, such as a distal joint that has an axial stiffness along the tube axis that is sufficient to induce buckling of the optical fiber; and a proximal joint mechanically coupling the proximal tube end of the piezo tube and the optical fiber. Optionally, the distal joint may have a lateral stiffness that is sufficient to accommodate lateral rotation of the optical fiber during buckling. Optionally, the distal joint has an axial stiffness along the tube axis that is sufficient to induce buckling of the optical fiber when a distance between the distal joint and the proximal joint is reduced by at least a threshold amount, such as a threshold amount that is about 5 µm or less, such as between 0.01 µm and 5 µm, between 0.1 µm and about 5 µm, or between 1 µm and 5 µm. It will be appreciated that useful piezo tubes include those having an inner diameter sufficient to accommodate buckling of the optical fiber between the distal joint and the proximal joint.

In embodiments, the optical fiber has a distal fiber end and a proximal fiber end, such as a distal fiber end of the optical fiber that extends distally beyond the distal tube end of the piezo tube. Optionally, the distal tube end of the piezo tube is positioned between the distal fiber end of the optical fiber and the proximal tube end of the piezo tube. Optionally, the proximal fiber end of the optical fiber extends proximally beyond the proximal tube end of the piezo tube. Optionally, the proximal tube end of the piezo tube is positioned between the proximal fiber end of the optical fiber and the distal tube end of the piezo tube. It will be appreciated that the distal fiber end of the optical fiber may be unconstrained. In embodiments, the proximal fiber end extends proximally beyond the proximal tube end of the piezo tube, and the distal fiber end extends distally beyond the distal tube end of the piezo tube.

A piezo tube may include a plurality of electrodes, such as for controlling lateral deflections of a distal tube end of the piezo tube end and a length of the piezo tube by application of one or more voltages. For example, the plurality of electrodes includes a first pair of electrodes extending along a length of the piezo tube and arranged 180° from one another. Optionally, the plurality of electrodes includes a second pair electrodes extending along the length of the piezo tube and arranged 180° from one another and 90° from the first pair of electrodes. Optionally, a buckling voltage is applied to the plurality of electrodes causes a length of the piezo tube to change, such as simultaneously with a whirling voltage.

It will be appreciated that a voltage source may be included in electrical contact with a plurality of electrodes. The voltage source may apply one or more whirling voltages to the plurality of electrodes, such as one or more whirling voltages that have a frequency of between about 10 kHz and about 80 kHz. Optionally, the voltage source applies one or more whirling voltages to the plurality of electrodes, such as one or more whirling voltages that have a frequency about equal to a natural frequency of a cantilevered portion of the optical fiber corresponding to a region of the optical fiber between the distal joint and a distal fiber end of the optical fiber. Optionally, voltage source may alternatively or additionally apply a buckling voltage to the plurality of electrodes, such as a buckling voltage that has a frequency of between about 15 Hz and about 300 Hz, such as about 60 Hz or about 120 Hz.

In another aspect, methods of scanning an optical fiber are provided. For example, a method of this aspect comprises applying a first voltage to an optical fiber scanning system to induce whirling of an optical fiber, applying a second voltage to the optical fiber scanning system to induce buckling of the optical fiber. The optical fiber scanning system used for methods of this aspect may correspond to any of the optical fiber scanning systems described herein, such as an optical fiber scanning system including the optical fiber, a first electromechanical transducer mechanically coupled to the optical fiber between the distal fiber end and the proximal fiber end and configured to apply a buckling force to the optical fiber; and a second electromechanical transducer mechanically coupled to the optical fiber between the distal fiber end and the proximal fiber end and configured to excite whirling of the distal fiber end. Optionally, the first electromechanical transducer includes a plurality of electrodes, and applying the second voltage includes applying the second voltage to the plurality of electrodes to induce longitudinal application of the buckling force. Optionally, the second electromechanical transducer includes a plurality of electrodes, and applying the first voltage includes applying the first voltage to the plurality of electrodes to induce lateral deflection of the optical fiber for exciting whirling of the distal fiber end. In some embodiments, whirling of the optical fiber causes the distal fiber end to deflect a first predetermined amount. In some embodiments, buckling of the optical fiber causes deflection of the distal fiber end by a second predetermined amount that is superimposed on the first predetermined amount.

In a specific embodiment, a method of scanning an optical fiber may comprise applying a first voltage to an optical fiber scanning system to induce whirling of an optical fiber of the optical fiber scanning system, such as any of the optical fiber scanning systems described herein. As an example, such an optical fiber scanning system may include a piezo tube, such as a piezo tube that includes a plurality of electrodes for controlling lateral deflections of a distal tube end of the piezo tube by application of the first voltage, and an optical fiber passing through the piezo tube.

The first voltage optionally has a sinusoidal profile, such as a sinusoidal profile that has a variable amplitude. Optionally, methods of this aspect comprise or further comprise applying a second voltage to the optical fiber scanning system to induce buckling of the optical fiber.

As another example, an optical fiber scanning system useful with the methods of this aspect may comprise or further comprise a buckling piezo having a second plurality of electrodes. Optionally, applying the second voltage includes applying the second voltage to the second plurality of electrodes to induce axial expansion or contraction of the buckling piezo, such as along a length of the buckling piezo. Optionally, applying the second voltage includes applying the second voltage to the plurality of electrodes to induce axial expansion or contraction of the piezo tube. Example second voltages include those having a frequency of between about 15 Hz and about 300 Hz, such as about 60 Hz or about 120 Hz. Example the second voltage may exhibit a sawtooth or triangular profile. Optionally, a delay may be used before the second voltage is applied. For example, applying the second voltage may include applying the second voltage a predetermined amount of time after applying the first voltage. It will be appreciated that applying the second voltage may include applying the second voltage after whirling of the optical fiber causes the optical fiber to deflect a predetermined amount. Optionally, whirling of the optical fiber causes the optical fiber to deflect a first predetermined amount and buckling of the optical fiber causes the optical fiber to deflect a second predetermined amount superimposed on the first predetermined amount. It will be appreciated that whirling of the optical fiber may corresponds to an end of the optical fiber moving in a circular path, a spiral path, with a Lissajou motion, etc.

The foregoing, together with other features and embodiments, will become more apparent upon referring to the following description, claims and accompanying drawings.

DETAILED DESCRIPTION

Described herein are embodiments of fiber scanning systems and methods of scanning optical fibers. The disclosed systems and methods advantageously provide an improvement to the scanning range, the oscillation amplitude, and/or the maximum pointing angle for an optical fiber in a fiber scanning system by inducing a buckling of a portion of the optical fiber.

It will be appreciated that the term "buckling" refers to a characteristic deformation that a structure will exhibit under a compressive load. Buckling may occur as the result of application of a force to an end of a structure or between two points within the structure. Buckling may result in a deformation of the structure that is transverse or otherwise not coaxial to the direction of the applied force. Buckling is commonly observed or characterized in columnar or elongated structures, where the structure will bow, flex, or bend between points of applied force, which may be applied at a fixed end of the structure, at a free end of the structure, or generally between two arbitrary points of the structure. Depending on the magnitude, direction, and location of the force applied, how quickly the force is applied, and the material properties of the structure, buckling can take on different modes. It will be appreciated that characteristic shape of the buckling may be dependent upon boundary conditions of the buckled structure, such as how and whether the ends of the structure are fixed or supported. The buckling employed in the present inventions advantageously make use of buckling modes in which a deflection of a free end of an optical fiber is amplified or otherwise increased by buckling occurring between points along the fiber's axis.

Figure 1:
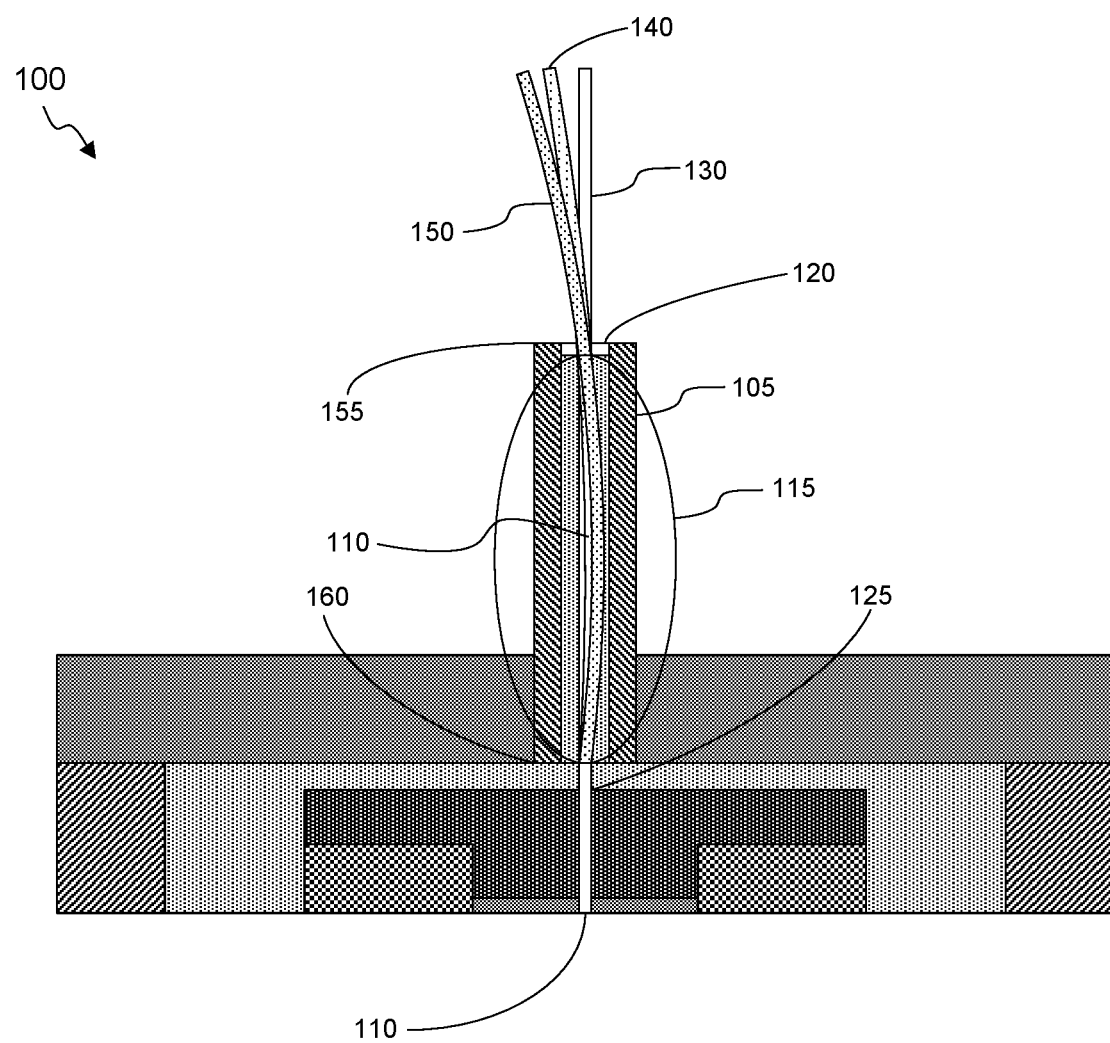
FIG. 1 provides a schematic illustrations of an example fiber scanning system showing increased fiber deflection with use of buckling of the optical fiber.

FIG. 1 provides a schematic illustration of an example fiber scanning system 100. As illustrated, fiber scanning system 100 includes a piezo tube 105 and an optical fiber 110 passing through piezo tube 105. It will be appreciated that the term "piezo" is used interchangeably with the terms "piezoelectric material," "piezoelectric transducer," "piezoelectric actuator," and "piezoelectric device" and refers to a material that exhibits a piezoelectric effect, such as the generation of a voltage when the material is deformed or the deformation of the material when a voltage or an electrical field is applied to the material. It will be appreciated that a variety of piezoelectric materials are useful with the systems and methods described herein. Example piezoelectric materials include certain ceramic materials, such as lead zirconate titanate (PZT), and certain crystalline materials, such as quartz. A piezo may be used, in various embodiments, as an actuator by controlled application of voltages to the piezoelectric material to induce controlled expansion, contraction, or deformation of the piezo. A piezo may have voltages applied between various points on the piezo to provide expansions, contractions, or deformations in any desired configuration, and application of voltages in particular configurations may result in deflection or bending motions in suitably designed piezo systems. For example, in some embodiments, a piezo tube may comprise a radially poled piezoelectric tube with, for example, four or more individual electrodes. Piezos may take on any suitable shape for a particular application. In some embodiments, piezos are constructed as tubular structures, such as a cylindrical structure having a central cylindrical opening. In other embodiments, piezos are constructed as cylindrical or cuboid shapes. Piezos may incorporate one or more electrodes to simplify or otherwise enable application of voltages to desired points on the material.

Piezo tube 105 may have a distal end 155 and a proximal end 160. For example, the distal end of piezo tube 105 may be free, while the proximal end 160 of piezo tube 105 may be fixed to another object or structure in order to restrict motion of the proximal end 160 of piezo tube 105 relative to the other object or structure. As used herein the terms "distal" and "proximal" are intended to reflect relative locations of objects, such as a piezo tube or an optical fiber. Other structures or objects may also be identified as having distal and proximal locations. For example, an optical fiber may have a distal end and a proximal end. The terms distal end and proximal end may refer to physical ends of an object or may refer to a location of an object defining a particular region. It will be appreciated that proximal and distal may be referenced relative to a single body or structure. In some embodiments, the terms proximal and distal may be interchanged with the terms first and second, top and bottom (or bottom and top), left and right (or right and left), etc. In one embodiment, the term proximal may be referenced to a mechanical ground while the term distal is referenced at a distance from the mechanical ground.

Piezo tube 105 includes an inner diameter that is larger than an outer diameter of optical fiber 110 such that there is space between optical fiber 110 and the inner surface of piezo tube 105. This configuration may allow piezo tube 105 to accommodate buckling of optical fiber 110, such as in buckling zone 115. It will be appreciated that the difference between the outer diameter of optical fiber 110 and inner diameter of piezo tube 105 may have any suitable magnitude such that optical fiber 110 does not contact the inner surface of piezo tube 105 during buckling. In some configurations, however, contact between optical fiber 110 and the inner surface of piezo tube 105 may result in a complex buckling motion.

Optical fiber 110 may take on any suitable configuration. For example, optical fiber 110 may comprise a glass-, polymer-, or plastic-based optical fiber. Optical fiber 110 may optionally include a core and cladding. Optical fiber 110 may optionally comprise a multi-core optical fiber. Optical fiber 110 may comprise a single-mode or multi-mode optical fiber. Optical fiber 110 may comprise a photonic crystal optical fiber. Optical fiber may comprise a visible optical waveguide, an infrared optical waveguide, and/or an ultraviolet optical waveguide. Optical fiber 110 may optionally comprise a plurality of optical fibers.

Points between ends of optical fiber 110 may be fixed to other objects. For example, as depicted in FIG. 1, optical fiber 110 and a distal end 155 of piezo tube 105 may be mechanically coupled at whirling distal joint 120. Optical fiber 110 may be fixed at a buckling distal joint 125. This configuration may advantageously allow optical fiber 110 to buckle in buckling zone 115. It will be appreciated that buckling of optical fiber 110 may be accomplished by any suitable relative motion between whirling distal joint 120 and buckling distal joint 125. For example, buckling may be induced by shortening the distance between whirling distal joint 120 and buckling distal joint 125, such as by moving buckling distal joint 125 along a direction towards whirling distal joint 120. Optionally, buckling of optical fiber 110 in buckling zone may be accomplished by shortening a length of piezo tube 105 such that whirling distal joint moves towards buckling distal joint 125.

Whirling distal joint 120 may comprise any suitable material to mechanically couple optical fiber 110 to the distal end 155 of piezo tube 105. Advantageously, whirling distal joint 120 may exhibit an axial stiffness along a direction parallel to a tube axis of piezo tube 105 that is sufficient to allow optical fiber to buckle when the distance between whirling distal joint 120 and buckling distal joint 125 is shortened. Optionally, buckling of optical fiber 110 may occur when the distance between whirling distal joint 120 and buckling distal joint 125 is decreased by more than a threshold amount. Example threshold amounts include 5 μm or less. Optionally, the axial stiffness may be equal to or greater than a lateral stiffness along one or more lateral axes perpendicular to the tube axis of piezo tube 105.

FIG. 1 illustrates three different configurations of optical fiber 110 to depict the advantage in deflection of optical fiber 110 that may be achieved through buckling. Optical fiber 110 is depicted in neutral orientation 130 in blue, where the optical fiber does not deflect. Piezo tube 105 may be induced to undergo a whirling motion through suitable application of voltages at points along piezo tube 105. Whirling motion may represent a circular, spiral, lissajou, or pseudo-circular motion of an end of an object. Whirling of piezo tube 105 may induce a distal end of optical fiber 110 to also undergo a whirling motion, such that optical fiber 110 may obtain a maximum whirling deflection depicted by whirling orientation 140 in green. It will be appreciated that whirling orientation 140 may represent the maximum deflection of optical fiber 110 that can be achieved by whirling alone. It will be further appreciated that the relative distances and sizes of objects and elements depicted in FIG. 1 are not to scale and are for illustrative purposes only in order to more clearly depict the advantages achieved by the instant inventions. Orientation 150 in red may represent the maximum deflection of optical fiber 110 that can be achieved by a combination of whirling and buckling of optical fiber 110 between whirling distal joint 120 and buckling distal joint 125.

It will be appreciated that buckling of optical fiber 110 may occur at any orientation of optical fiber 110 as it undergoes whirling motion. It may be advantageous for buckling of optical fiber 110 to take place when optical fiber is displaced through whirling of piezo tube 105 so that the direction of buckling is predictable and/or controllable. For example, when optical fiber 110 is in neutral orientation 130 and buckling is induced by reducing a distance between whirling distal joint 120 and buckling distal joint 125, the buckling may occur in any direction, which may be unpredictable. By inducing buckling of optical fiber 110 when optical fiber already is displaced through a whirling motion of piezo tube 105, such as in orientation 140, the direction of buckling may be predictable and relate to the whirling motion, such that an increase in the deflection of optical fiber 110 may be achieved, as depicted in orientation 150.

Figure 2B:
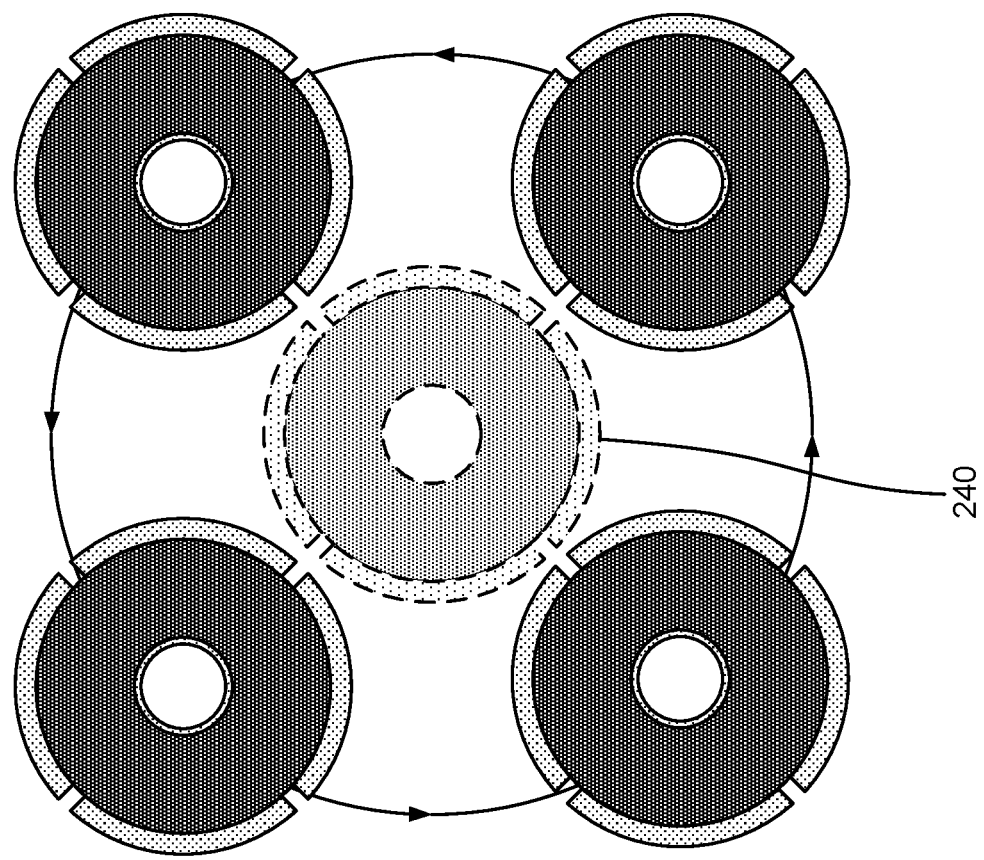
FIG. 2A provides a schematic illustration of a piezo tube component of a fiber scanning system and FIG. 2B provides a schematic overview of whirling motion of the piezo tube.
Figure 2A:
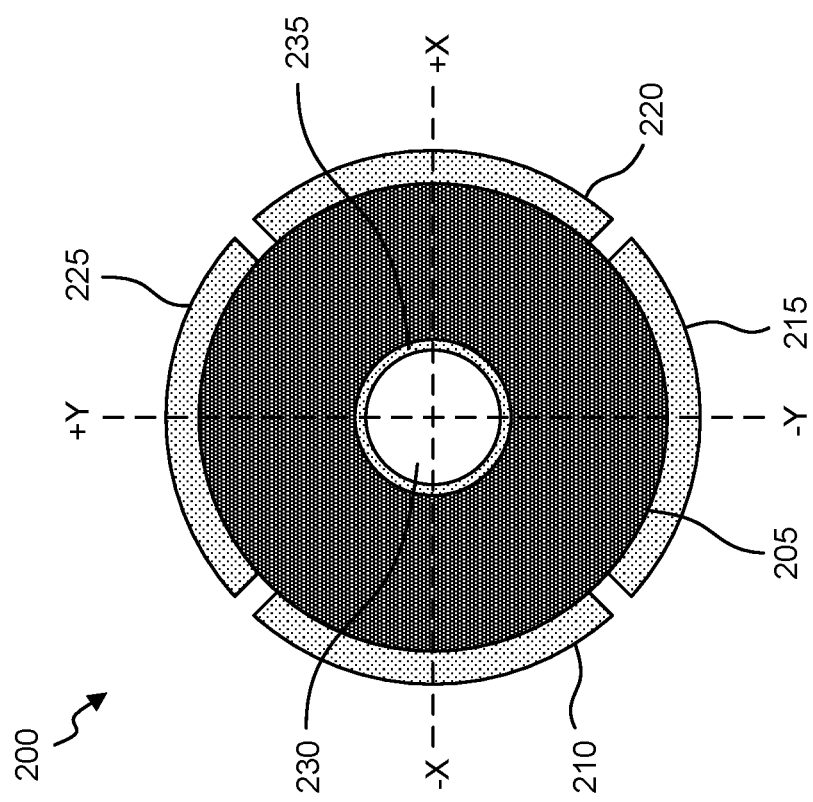

FIG. 2A provides a schematic illustration of a cross sectional view of piezo tube 200. As illustrated, piezo tube 200 includes piezo body 205, four electrodes 210, 215, 220, and 225 and a central opening 230. Electrodes 210-225 advantageously allow for application of voltages to enable deformation of piezo tube 200 in multiple directions. FIG. 2B depicts motion (exaggerated) of a distal end of the piezo tube 200 in a circular pattern, referenced to the neutral position 240, by application of appropriate voltages to the four electrodes 210-225. An inner electrode 235, positioned in electrical contact with the inner surface of piezo tube 200, may be included, which may correspond to a plating positioned on the internal surface of opening 230. Optionally, the inner electrode may provide a voltage ground or other reference voltage from which all other voltages are offset. Alternatively or additionally, one or more additional electrodes may be positioned in electrical contact with one or both ends of the piezo tube 200. Piezo tube 200 may be the same as or different from other piezo tubes described herein, such as piezo tube 105.

Figure 4:
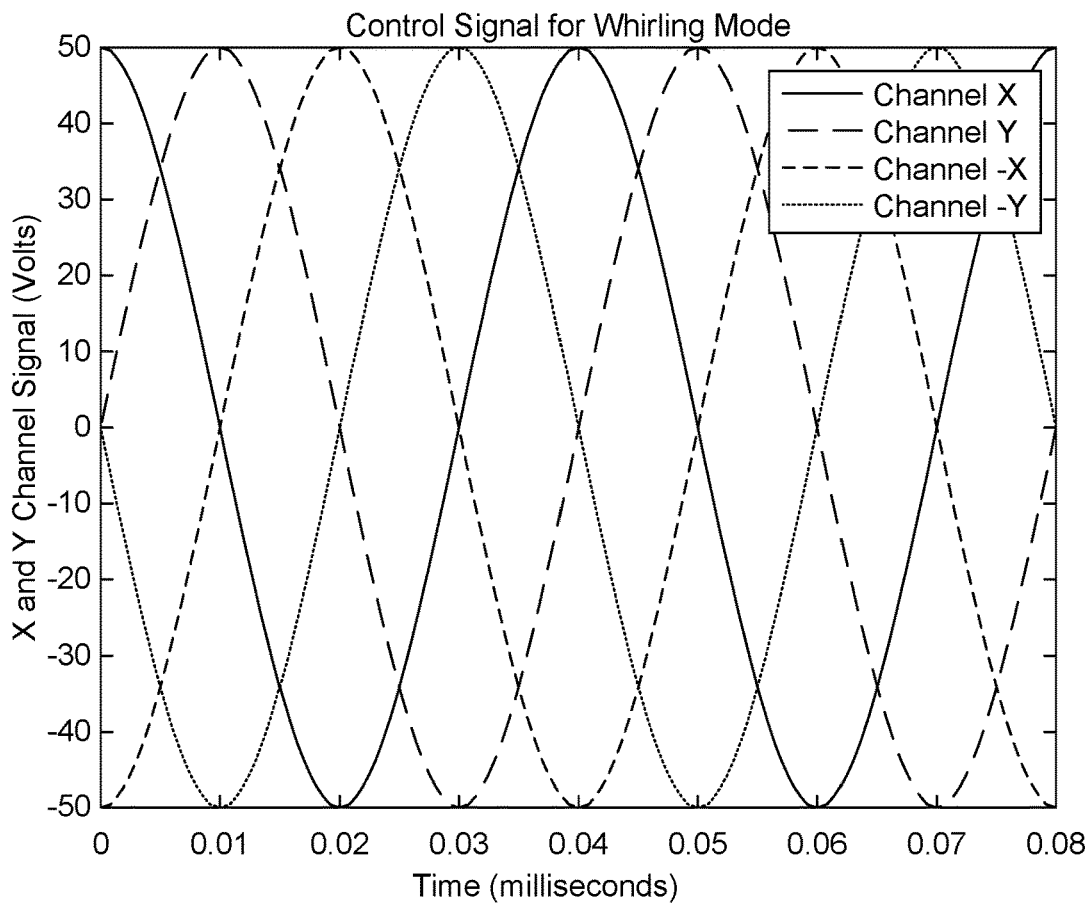
FIG. 4 provides a plot of example voltages applied to different electrodes of a piezo tube of a fiber scanning system for inducing a whirling motion.

FIG. 4 provides a plot illustrating example piezo drive voltages for whirling of a distal end of a piezo tube. For example, the depicted piezo drive voltages may be applied to the four electrodes 210-225 to induce whirling of a distal end of a piezo tube, and reflect a drive frequency of about 25 kHz. Other frequencies may be useful for whirling voltages, including frequencies of between about 10 kHz and about 80 kHz, such as between about 15 kHz and about 40 kHz or between about 40 kHz and about 75 kHz. It will be appreciated that a magnitude or amplitude of the whirling voltages may change as a function of time in order to increase or decrease a whirling deflection. For example, the whirling voltages may exhibit a change in magnitude or amplitude from about 0 V, representing the neutral position or zero deflection, to a maximum magnitude or amplitude, representing maximum whirling deflection, to allow for a distal end of piezo tube 200 to follow a spiral-shaped deflection or whirling pattern. U.S. patent application Ser. No. 14/156,366, filed on Jan. 15, 2014, and hereby incorporated by reference, describes additional details about piezo drive voltages and suitable electronics to induce whirling of an optical fiber.

Figure 3:
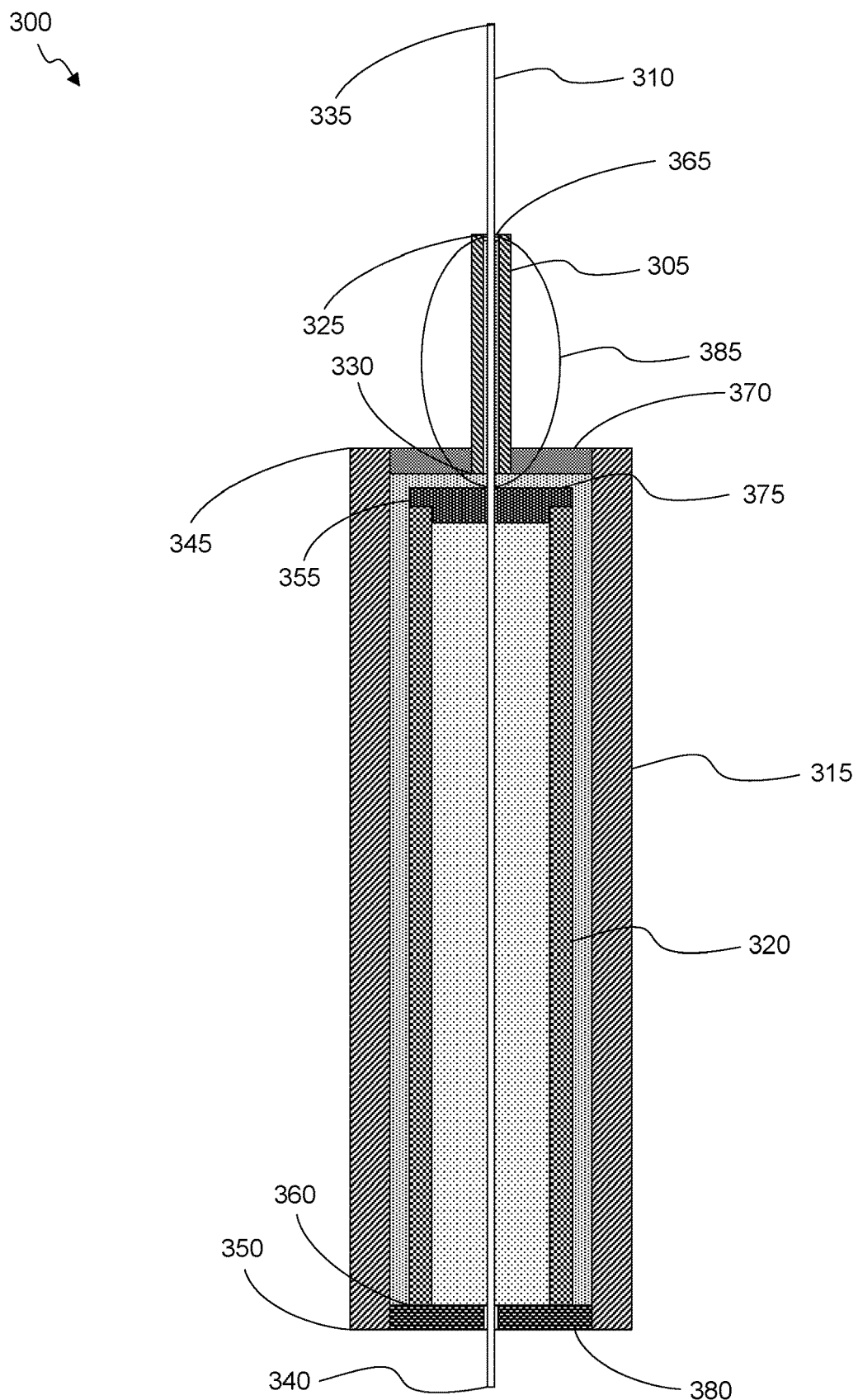
FIG. 3 provides a schematic illustration of a cross-section of an example fiber scanning system of some embodiments.

FIG. 3 provides a schematic illustration of an example fiber scanning system 300, which may be the same as or different from fiber scanning system 100 depicted in FIG. 1. Fiber scanning system 300 includes piezo tube 305, optical fiber 310 passing through piezo tube 305, support tube 315 mechanically coupled to piezo tube 305, and buckling piezo 320 disposed inside support tube 315 and mechanically coupled to optical fiber 310. As illustrated, piezo tube 305 has a distal tube end 325 and a proximal tube end 330; optical fiber 310 has a distal fiber end 335 and a proximal fiber end 340; support tube 315 has a distal end 345 and a proximal end 350; buckling piezo 320 has a distal piezo end 355 and a proximal piezo end 360.

As illustrated, optical fiber 310 and distal tube end 325 of piezo tube 305 are mechanically coupled at distal whirling joint 365; proximal tube end 330 of piezo tube 305 and distal end 345 of support tube 315 are mechanically coupled at proximal whirling joint 370; optical fiber 310 and distal piezo end 355 of buckling piezo 320 are mechanically coupled at buckling distal joint 375; proximal piezo end 360 of buckling piezo 320 and proximal end 350 of support tube 315 are mechanically coupled at buckling proximal joint 380.

As illustrated, distal tube end 325 of piezo tube 305 is positioned between distal fiber end 335 of optical fiber 310 and proximal tube end 330 of piezo tube 305; proximal tube end 330 of piezo tube 305 is positioned between proximal fiber end 340 of optical fiber 310 and distal tube end 325; distal piezo end 355 of buckling piezo 320 is positioned between proximal tube end 330 of piezo tube 305 and proximal piezo end 360 of buckling piezo 320.

When buckling of optical fiber 310 is induced, for example by decreasing the distance between distal whirling joint 365 and distal buckling joint 375, optical fiber 310 buckles in buckling zone 385 (i.e., between distal whirling joint 365 and distal buckling joint 375). An inner diameter of piezo tube 305 may be of a sufficient diameter to accommodate buckling of optical fiber 310 in buckling zone 385 without optical fiber 310 contacting the inner surface of piezo tube 305.

A structural loop may be used to describe the conceptual flow of forces in fiber scanning system 300. It will be appreciated that structural loops may be useful in determining system stiffness, symmetry, dynamic response, etc. It will further be appreciated that the flow of force through buckling zone 385 is used to induce buckling of optical fiber in a lateral motion. The lateral motion may amplify displacement of distal fiber end 335 relative to the unbuckled configuration. The lateral motion may arise due to movement of distal buckling joint 375 along the displacement direction, which is in an axial direction (vertical direction in FIG. 3). In FIG. 3, starting from the bottom of the figure at proximal buckling joint 380, forces for the structural loop flow up buckling piezo 320 to distal buckling joint 375, from distal buckling joint 375 radially into optical fiber 310, upward along optical fiber 310 to distal whirling joint 365, from distal whirling joint 365 radially into piezo tube 305, downward along piezo tube 305 to proximal whirling joint 370, from proximal whirling joint 370 radially to support tube 315, downward along support tube 315 to proximal buckling joint 380, and from proximal buckling joint 380 radially back to buckling piezo 320. It will be appreciated that the unconstrained portion of optical fiber 310 between distal whirling joint 365 and distal fiber end 335 falls outside the structural loop, indicating that this portion of optical fiber 310 is substantially free from forces in the structural loop. However, it will be appreciated that buckling of the optical fiber 310 in buckling zone 385 may impact the orientation of optical fiber 310 at distal whirling joint 365. This may allow for a deflection of the distal fiber end 335 to be achieved by buckling of optical fiber 310 in buckling zone 385.

Voltages may be applied to buckling piezo 320 at or proximal to distal piezo end 355 and at or proximal to proximal piezo end 360 in order to induce a buckling displacement. Depending on the configuration, application of voltages to buckling piezo 320 may cause buckling piezo 320 to expand or contract along a piezo axis, such as in the vertical direction in FIG. 3. As illustrated in FIG. 3, expansion of buckling piezo 320 along the piezo axis will result in a displacement of distal buckling joint 375 such that a distance between distal buckling joint 375 and distal whirling joint 365 is decreased to induce buckling of optical fiber 310 in buckling zone 385.

Figure 5:
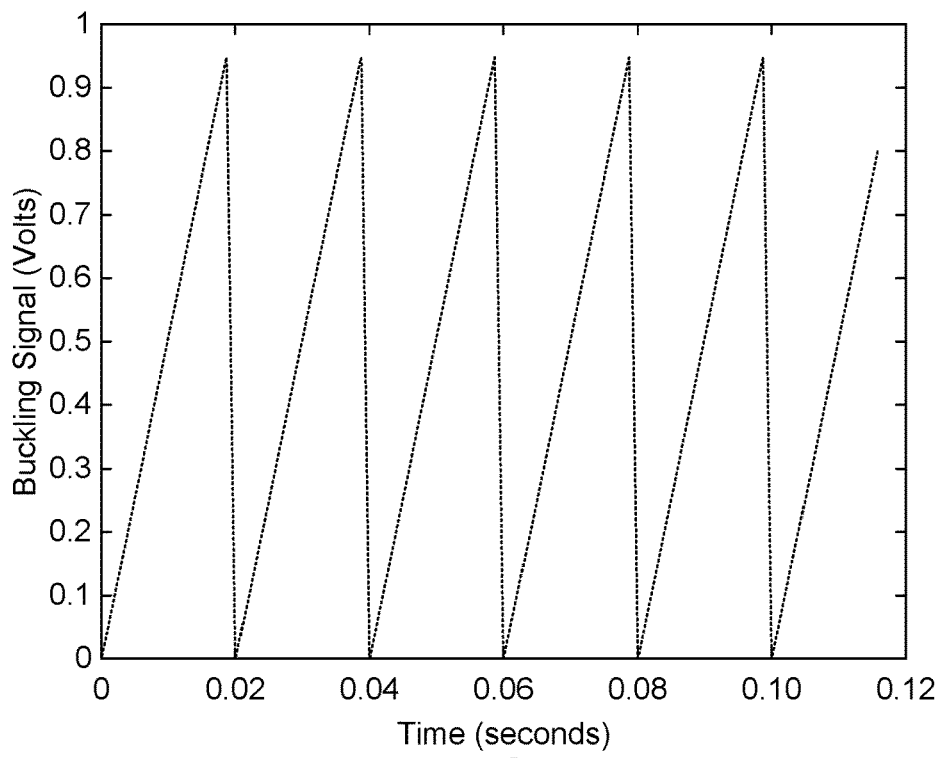
FIG. 5 provides a plot of example voltages applied to electrodes of a piezo of a fiber scanning system for inducing a buckling motion.

FIG. 5 provides a plot illustrating example buckling drive voltages for driving a buckling piezo to induce increased buckling of an optical fiber as a function of time. The repetition rate of the sawtooth voltage profile shown in FIG. 5 is about 50 Hz, which may represent a frame rate or refresh rate of a display for a fiber scanning display incorporating a fiber scanning system. It will be appreciated that other buckling drive voltages and configurations may be used. For example, other repetition frequencies may be used, such as frequencies between about 15 Hz and about 300 Hz, including common frame rates or refresh rates of about 23.976 Hz, about 24 Hz, about 25 Hz, about 29.97 Hz, about 50 Hz, about 59.94 Hz, about 60 Hz, about 85 Hz, about 120 Hz, and about 240 Hz. Other voltage profiles may be used, such as triangular profiles, sinusoidal profiles, trapezoidal profiles, square profiles, etc. Additionally, buckling drive voltage profiles may include periods of zero voltage, such as at the beginning of a cycle, which may represent a delay before the start of buckling of an optical fiber. Inclusion of a delay may be useful, for example, to allow for a whirling voltage to first generate a deflection of a suitable magnitude in the optical fiber before application of a buckling motion is introduced. In this way, the direction of buckling may be controlled to match the direction of the deflection instead of inducing random buckling which may occur at low or zero initial whirling displacements.

It will be appreciated that buckling piezos used in fiber scanning systems described herein may take on any suitable configuration and may include one or more electrodes, such as positioned at opposite ends of the buckling piezos. As illustrated in FIG. 3, buckling piezo 320 is configured as a tubular piezo. Use of a tubular piezo for buckling piezo may be advantageous and provide a cylindrically symmetric configuration. Other embodiments are contemplated, such as where buckling piezo comprises one or more separate, non-tubular, piezos. Optionally, buckling piezo may incorporate or otherwise comprise a piezo stack, corresponding to a plurality of individual piezo elements stacked together. It will be appreciated that piezos, including tubular piezos, piezo stacks, etc., may be commercially available. Optionally, a piezo stack may refer to a construction of a plurality of individual piezoelectric material layers that are electrically connected in parallel such that a single voltage may be simultaneously applied to or across each of the individual piezoelectric material layers. Use of piezo stacks may be advantageous, in some embodiments, as a piezo stack may exhibit a larger overall displacement for a particular voltage than a similarly sized single piezo element.

Figure 6:
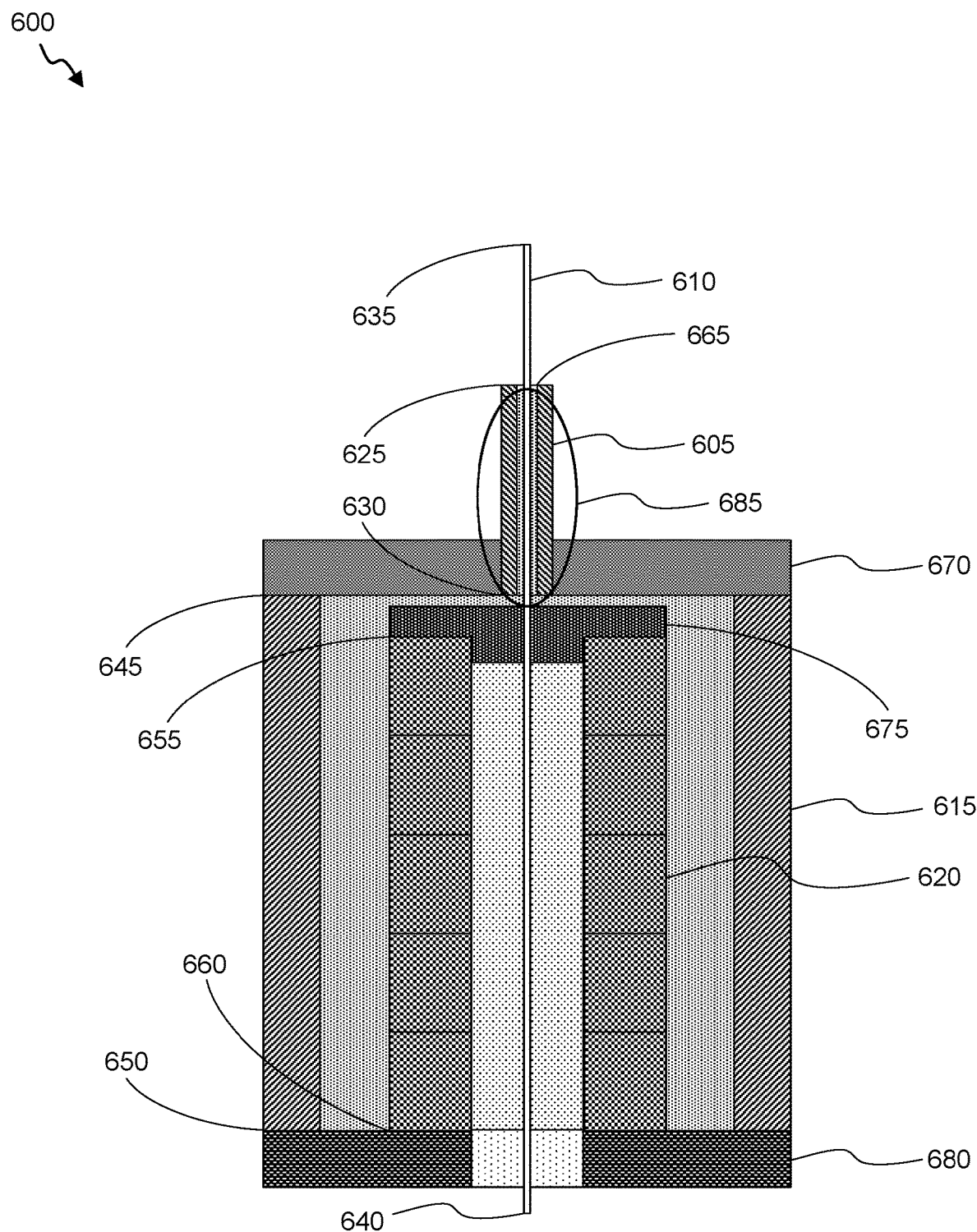
FIG. 6 provides a schematic illustration of a cross-section of an example fiber scanning system of some embodiments.

FIG. 6 provides a schematic illustration of an example fiber scanning system 600 including a buckling piezo comprising a piezo stack. Fiber scanning system 600 depicted in FIG. 6 is similar to fiber scanning system 300 depicted in FIG. 3. For example, fiber scanning system 600 includes piezo tube 605, optical fiber 610 passing through piezo tube 605, support tube 615 mechanically coupled to piezo tube 605, and buckling piezo stack 620 disposed inside support tube 615 and mechanically coupled to optical fiber 610. As illustrated, piezo tube 605 has a distal tube end 625 and a proximal tube end 630; optical fiber 610 has a distal fiber end 635 and a proximal fiber end 640; support tube 615 has a distal end 645 and a proximal end 650; buckling piezo stack 620 has a distal piezo end 655 and a proximal piezo end 660. It will be appreciated that, while buckling piezo stack 620 is illustrated as having five individual piezo components, more or fewer individual piezo components may be included in a piezo stack.

As illustrated, optical fiber 610 and distal tube end 625 of piezo tube 605 are mechanically coupled at distal whirling joint 665; proximal tube end 630 of piezo tube 605 and distal end 645 of support tube 615 are mechanically coupled at whirling proximal joint 670; optical fiber 610 and distal piezo end 655 of buckling piezo stack 620 are mechanically coupled at distal buckling joint 675; proximal piezo end 660 of buckling piezo stack 620 and proximal end 650 of support tube 615 are mechanically coupled at buckling proximal joint 680. Buckling of optical fiber 610 occurs in buckling zone 685, which is positioned between distal whirling joint 665 and distal buckling joint 675.

In operation, one or more voltages may be provided to piezo tube 605 to induce motion of distal tube end 625 of piezo tube 605, such as by way of one or more electrodes of piezo tube 605. Similarly, one or more voltages may be provided to buckling piezo stack 620 to induce axial expansion and/or contraction of buckling piezo stack 620 along the tube axis of buckling piezo stack, such as by way of one or more electrodes of buckling piezo stack 620. One or more voltage sources may be positioned in electrical communication or electrical contact with the electrodes of piezo tube 605 and piezo stack 620. As described above with reference to FIGS. 4 and 5, whirling voltages having a frequency of between about 10 kHz and about 80 kHz may be applied to piezo tube 605 to induce whirling of distal tube end 625 of piezo tube 605 and optical fiber 610, such as at positions between distal whirling joint 665 and distal fiber end 635, by the one or more voltage sources. Buckling voltages having a repetition frequency of between about 15 Hz and about 300 Hz may be applied to buckling piezo stack 620 to induce expansion and/or contraction of buckling piezo stack 620 by the one or more voltage sources.

In the configurations described in FIGS. 3 and 6, the buckling of the optical fiber is achieved by expanding the buckling piezo or buckling piezo stack. Configurations are contemplated, however, where buckling is achieved by contracting a piezo. For example, in another configuration, a distal buckling joint may be mechanically attached to proximal whirling joint and, instead of the optical fiber being mechanically coupled to the buckling piezo or buckling piezo stack at the distal buckling joint, the optical fiber may be mechanically coupled to the buckling piezo or piezo stack at a proximal buckling joint such that the buckling zone is expanded to the region between the distal whirling joint and the proximal buckling joint. To induce buckling of the optical fiber in this alternative configuration, a contraction of the buckling piezo or buckling piezo stack along the piezo axis will result in a displacement of the proximal buckling joint such that a distance between the proximal buckling joint and the distal whirling joint is decreased. Such a configuration may provide a number of advantages including optional elimination of the support tube, due to the mechanical coupling of the piezo tube and the buckling piezo or buckling piezo stack.

Figure 7:
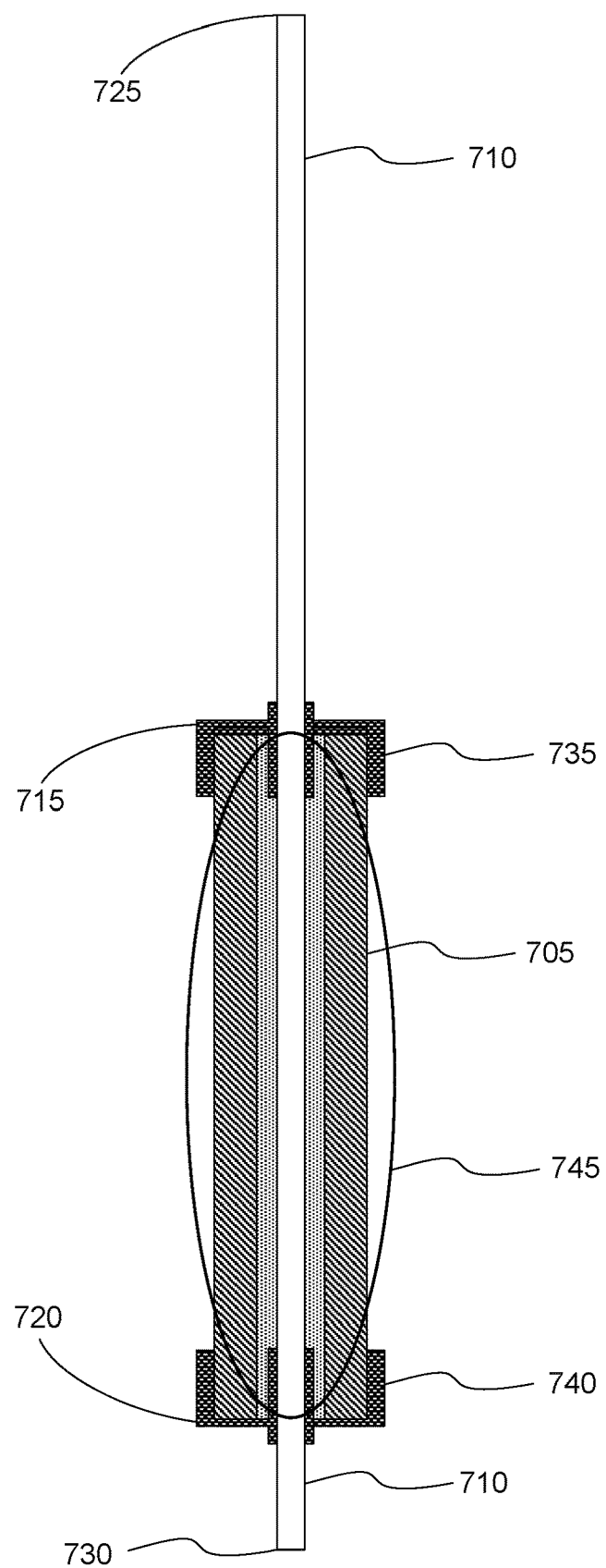
FIG. 7 provides a schematic illustration of a cross-section of an example fiber scanning system of some embodiments.

Additional fiber scanning system configurations are further contemplated herein where a single piezo tube is used for both whirling and buckling. For example, FIG. 7 provides a schematic illustration of a fiber scanning system 700 using a single piezo tube for buckling and whirling of an optical fiber. Fiber scanning system 700 includes piezo tube 705 and optical fiber 710 passing through piezo tube 705. Piezo tube 705 has a distal tube end 715 and a proximal tube end 720 and optical fiber 710 has a distal fiber end 725 and a proximal fiber end 730. Distal tube end 715 of piezo tube 705 is positioned between distal fiber end 725 of optical fiber 710 and proximal tube end 720 of piezo tube 705. Proximal tube end 720 is positioned between proximal fiber end 730 of optical fiber 710 and distal tube end 715 of piezo tube 705.

Fiber scanning system also includes distal joint 735, which mechanically couples the distal tube end 715 of piezo tube 705 and optical fiber 710, and proximal joint 740, which mechanically couples the proximal tube end 720 of piezo tube 705 and optical fiber 710. Advantageously, distal joint 735 and proximal joint 740 exhibit mechanical characteristics for facilitating buckling of optical fiber 710 in buckling zone 745 between distal joint 735 and proximal joint 740. For example, distal joint 735 may exhibit an axial stiffness along an axis of piezo tube 705 that is of a sufficient magnitude to permit buckling of optical fiber 710 by shortening a length of piezo tube 705 between distal joint 735 and proximal joint 740. Distal joint 735 may exhibit a lateral stiffness along one or more lateral directions perpendicular to the tube axis of piezo tube 705 that is of a sufficient magnitude to accommodate lateral or angular deflections of optical fiber such that buckling of optical fiber between distal joint 735 and proximal joint 740 causes displacement of the distal fiber end 725 of optical fiber 710. Optionally, the axial stiffness of distal joint 735 may be less than or about equal to a lateral stiffness of distal joint 735. Additionally or alternatively, proximal joint 740 may exhibit an axial stiffness along an axis of piezo tube 705 that is of a sufficient magnitude to permit buckling of optical fiber 710 by shortening a length of piezo tube 705 between distal joint 735 and proximal joint 740. In some embodiments, no constraints are imposed on the lateral or axial stiffness of proximal joint 740. Optionally, a lateral stiffness of proximal joint 740 is of a magnitude sufficient to provide a fixed and non-rotatable joint such that angular deflection of optical fiber 710 at proximal joint 740 is prevented.

To achieve the desired whirling and buckling motions of piezo tube 705, voltages may be applied to piezo tube 705 with different frequency characteristics. As described above and with reference to FIGS. 4 and 5 and their associated description, the whirling voltages may have a higher frequency than the buckling voltage. The buckling and whirling voltages may be applied to piezo tube 705 as a superposition of the buckling voltage and a whirling voltage. In this way, an overall length of piezo tube 705 may be controlled by way of a common buckling profile component of the voltages applied to each of, for example, four electrodes of piezo tube 705, while the whirling motion of piezo tube 705 may be controlled by way of the individual whirling voltage components of each of the voltages applied to the four electrodes.

Figure 8A:
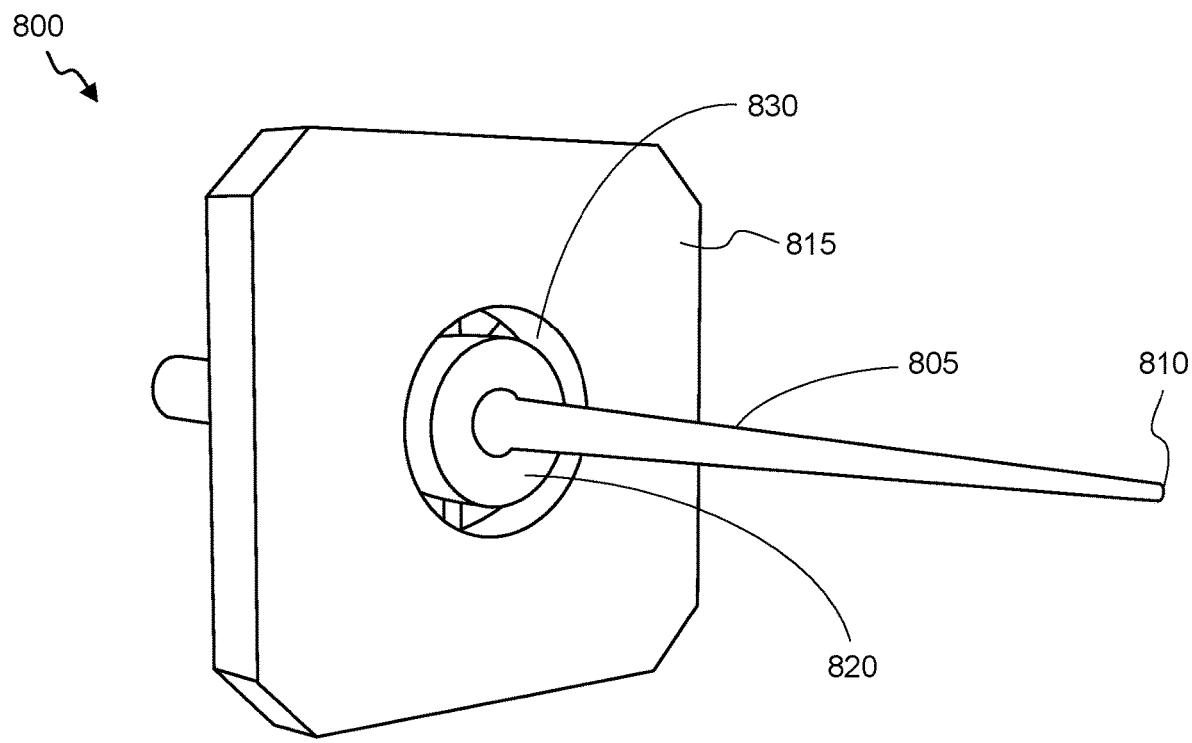
FIG. 8A, FIG. 8B, FIG. 8C, and FIG. 8D provide schematic illustrations of an example fiber scanning system of some embodiments.
Figure 8B:
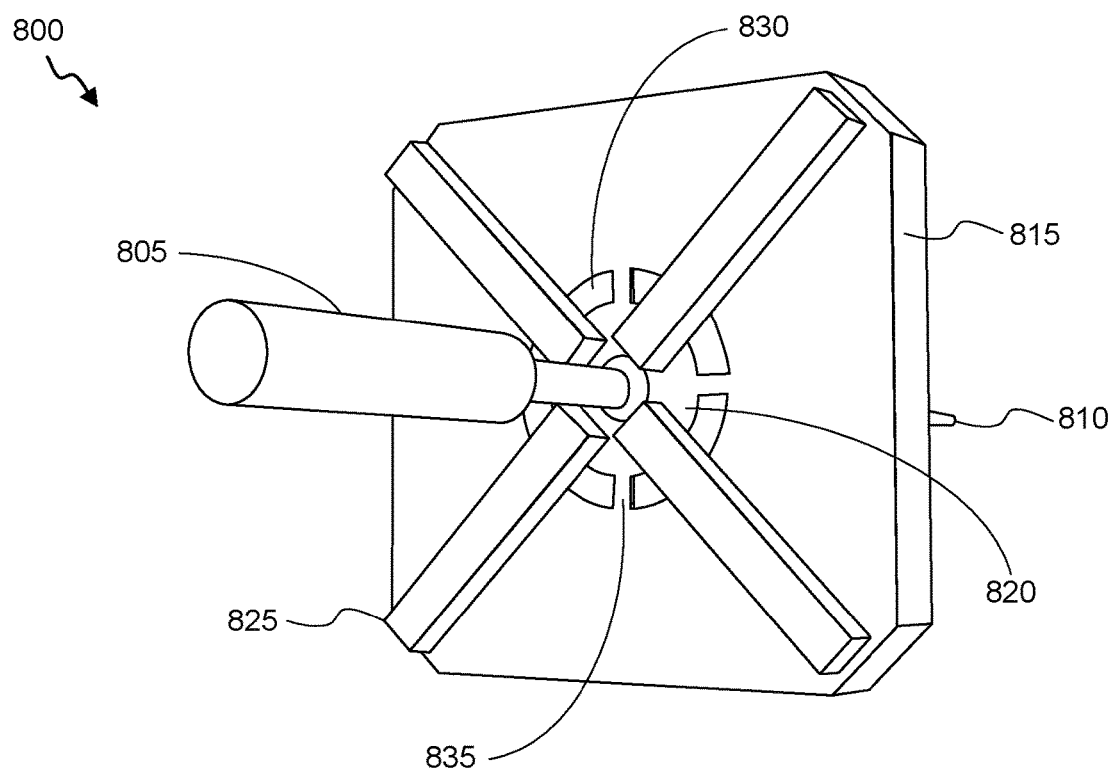
Figure 8C:
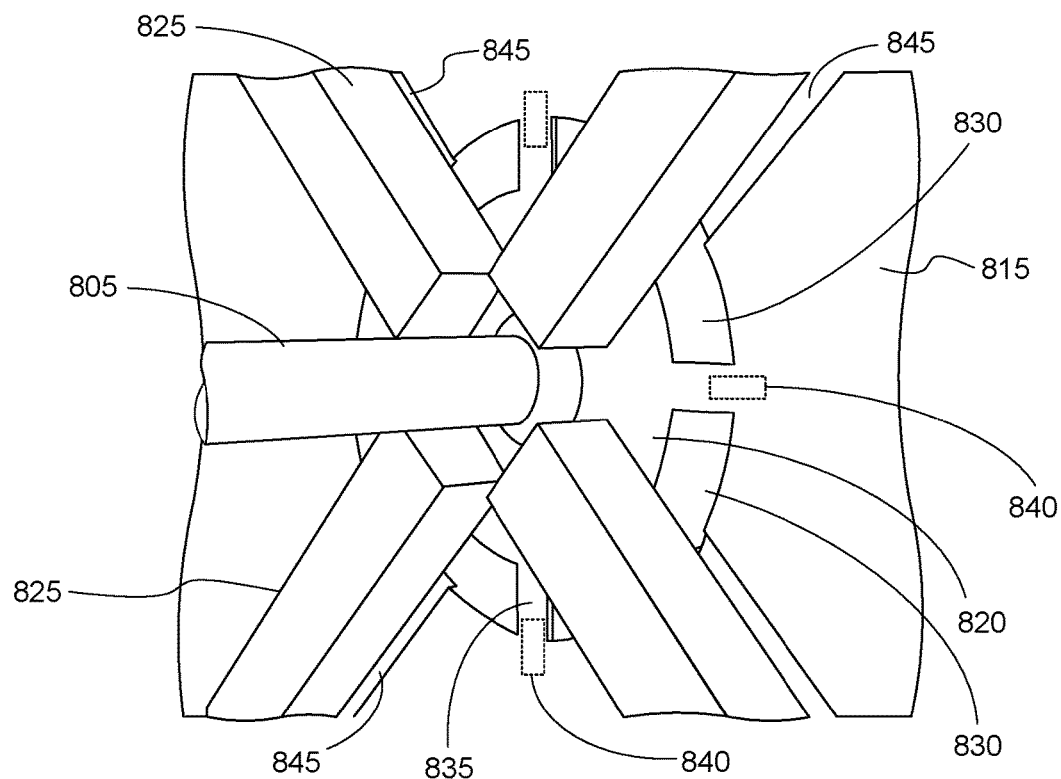

FIGS. 8A-8C provide schematic views of a hub-and-frame based whirling mechanism that is useful with the disclosed optical fiber scanning systems. FIG. 8A shows a perspective view of a first side of an optical scanning system 800. Optical scanning system 800 includes tapered fiber 805. Light emitted from a distal end 810 of tapered fiber 805 is projected. The optical scanning system 800 also includes a frame 815 and hub 820 driven by piezoelectric elements 825 (not visible in FIG. 8A). Piezoelectric elements 825 are coupled to both frame 815 and hub 820 to cooperatively induce oscillation of tapered fiber 805 in a predefined pattern.

FIG. 8A illustrates a gap 830 between hub 820 and frame 815. In some embodiments, hub 820 can be configured to rotate or tilt in place to achieve a desired scan pattern of tapered fiber 805 and in other embodiments, hub 820 can be configured to shift laterally to induce the desired scan pattern. While hub 820 is depicted having a circular shape it should be appreciated that many other shapes such as elliptical, rectangular and other polygonal geometries are also possible.

FIG. 8B shows how hub 820 can be coupled to frame 815 by multiple flexures 835. Flexures 835 can have a strain sensor incorporated within frame 815 and/or flexure 835. Actuation of piezoelectric elements 825 extends and contracts longitudinally to maneuver hub in a pattern that maneuvers distal end 810 of tapered fiber 805 in a circular pattern, for example. This movement can be accomplished by sequentially actuating piezoelectric elements 825. For example, a first piezoelectric element can be actuated first, followed by a second piezoelectric element, located adjacent clockwise or counterclockwise from first piezoelectric element, followed by a third piezoelectric element and a fourth piezoelectric element. Actuation may follow the control signal as shown in FIG. 4, for example. Although four piezoelectric elements are illustrated, two or more piezoelectric elements (e.g., 2-20) may be used. When only two piezoelectric elements are used, for example, each element may be used to first expand in one direction to generate a first lateral deflection and then contract to generate a second later deflection opposite to first lateral deflection. In some embodiments, piezoelectric element on opposing sides of hub 820 can be actuated concurrently, such as where one piezoelectric element extends longitudinally and the other contracts longitudinally. In some embodiments, piezoelectric elements are on opposing sides of hub 820. By varying actuation of piezoelectric elements, varying scan patterns can be achieved.

Figure 8D:
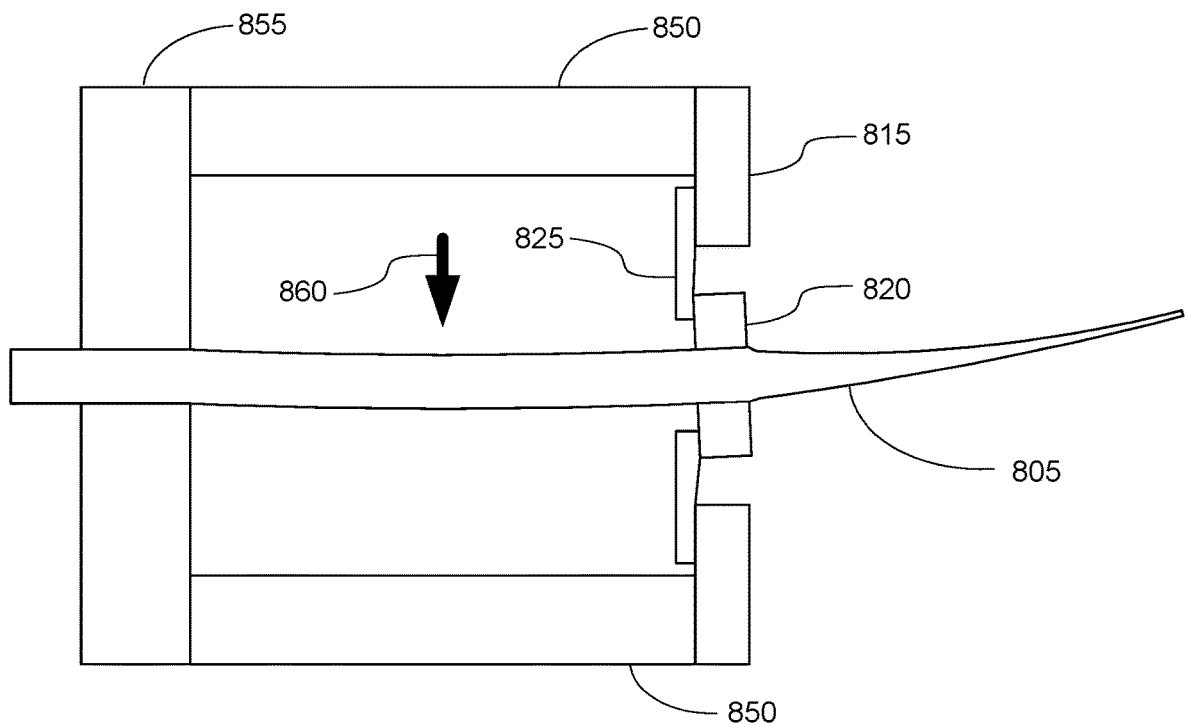

FIG. 8C shows a close up view of hub 820 and where piezoelectric elements 825 are attached to hub 820 by flexures 835. Strain sensors 840 can be adjacent to or extending across flexures 835. Strain sensors 840 can be configured to monitor movement of hub 820 and tapered fiber 805. Strain sensors 840 can be configured to monitor twisting and flexing of flexures 835. The twisting and flexing of flexures 835 monitored by strain sensors 840 can be used to carry out closed loop feedback control to achieve a consistent desired scan pattern. In some embodiments, each flexure can include multiple strain sensors 840 to measure different types of stresses being experienced by each of flexures 835. FIG. 8D also shows a close-up view of how piezoelectric elements 825 are arranged above and/or within channels 845 of frame 815. Channels 845 can be arranged and shaped to accommodate lateral motion of piezoelectric strips 825 during actuation and movement of hub 820.

FIG. 8D shows a side cross-sectional view of a hub-and-frame actuation based whirling mechanism incorporated into a fiber scanning system with buckling actuation. As illustrated, frame 815 is mechanically attached to the distal end of buckling piezo 850. Buckling piezo 850 is mechanically attached to proximal end of buckling piezo 850 by way of element 855, which may correspond to a proximal buckling joint. By compressing the distance between element 855 and hub 820, tapered fiber 805 can be induced to buckle along a lateral direction, as indicated by arrow 860 in FIG. 8D. Buckling actuation may follow the control signal depicted in FIG. 5, for example, where buckling may ramp over time as distal end 810 of tapered fiber 805 undergoes whirling, such as along a spiral pattern. Although FIG. 8D shows the piezo elements 825 as positioned inside buckling piezo 850, embodiments may include where the piezo elements 825 are on an opposite side of frame 815 and hub 820 and closer to the tapered portion of fiber 805. Configurations are also contemplated where piezo elements 825 are positioned within gap 830.

It will be appreciated that, when used in a fiber scanning display, the whirling voltage of a sinusoidal signal may have an amplitude that increases as a function of time, which may result in the distal end of the optical fiber being maximally deflected, such as along a spiral pattern, further and further from a zero position. The minimum to maximum sinusoidal amplitude change may have a repetition rate matching a refresh or frame rate of the display. The buckling voltage amplitude may similarly increase as a function of time, with a repetition rate matching a refresh or frame rate of the display. These amplitude increases may optionally be synchronized. Optionally, the application of the buckling voltage may be delayed by a particular amount of time in order for whirling of the optical fiber to begin so that the buckling may occur at a time where the buckling direction is predictable and matches the whirling direction since, in some embodiments, at low or zero deflection the application of the buckling voltage may cause buckling to occur in an unpredictable direction. Additionally or alternatively, the application of the buckling voltage may be delayed by a particular amount of time until the additional deflection gains that may be achieved by buckling are needed, such as near the time when the whirling deflection is close to, nearing, or otherwise reaching its maximum range.

Methods for scanning an optical fiber are also disclosed herein. In a general method, a first voltage is applied to an optical fiber scanning system to induce whirling of an optical fiber; a second is further applied to the optical fiber scanning system to induce buckling of the optical fiber. It will be appreciated that any of the optical fiber scanning systems described herein may be used with the disclosed methods, such as any of the optical fiber scanning systems depicted in FIGS. 1, 3, 6, 7, and 8A-8D. For example, the first voltage may be applied to a piezo tube and the second voltage may be applied to a buckling piezo. In another example, both the first and second voltages are applied to a single piezo tube. Optionally, the first and second voltages are superimposed.

The first voltage may have a frequency representative of the motion associated with whirling the optical fiber, and may correspond to one or more sinusoidal voltage profiles, which may increase in amplitude in order to whirl the optical fiber in a spiral pattern. The frequency of the first voltage may match or approximately match the natural resonant frequency of the oscillating portion of the optical fiber. Depending on the configuration, this frequency may fall within the range of about 10 kHz to about 80 kHz. The first voltage may also exhibit a slower repetition frequency representative of a refresh or frame rate for a display, during which the high frequency whirling voltage is repeated to whirl the optical fiber in a repeated spiral motion.

The second voltage, associated with the buckling motion, may also have a repetition frequency representative of a refresh or frame rate for the display. Depending on the configuration, this frequency may fall within the range of about 15 Hz to about 300 Hz, and repetition frequencies matching common refresh rates of 60 Hz or 120 Hz may be used. As described above, the second voltage may have a square, sawtooth, triangular, trapezoidal or other profile. Optionally, the second voltage may increase in amplitude during each repetition and may also include one or more periods of constant or decreasing voltage. Optionally, an increase in the second voltage amplitude may be synchronized with all or part of an increase in amplitude of the first voltage.

It will be appreciated that more or fewer components may be included in the fiber scanning systems described herein. For example, fiber scanning systems may include one or more voltage sources in electrical communication or electrical contact with a piezo, such as a piezo tube and/or a buckling piezo or piezo stack. Voltage sources useful with the systems and methods described herein include computer controlled voltage sources, programmable voltage sources, etc. Voltages applied to piezo materials may take on any suitable magnitude. For example, low voltage piezo materials may be used with the methods and systems described herein, which may be driven by application of voltages having magnitudes between about 0 V and about 150 V. Optionally, higher or lower maximum voltage piezos may be employed. It will be appreciated that, in some embodiments, a computer may generate a control voltage, such as a voltage between about 0 V and about 10 V or between about −10 V and about 10 V, for example, and this control voltage may be used to drive a programmable voltage source, such as a voltage drive or amplifier, as an input signal to the programmable voltage source. The programmable voltage source may then convert and/or amplify the input signal to a higher voltage signal, such as between about 0 V and about 100 V or between about −100 V and about 100 V, for example, to drive a piezo or piezo stack.

Optionally, optical sources may be used with the systems and methods described herein. For example, fiber scanning systems may include one or more optical sources optically coupled to an optical fiber to permit electromagnetic radiation to be waveguided and or otherwise passed through the optical fiber to generate an electromagnetic radiation output at a distal fiber end of an optical fiber. Such a configuration may correspond, at least in part, to a fiber scanning display. Optical sources may be switchable, computer controlled, and/or programmable. By synchronously controlling the timing of outputs generated by an optical source as the distal fiber end of the optical fiber is moved by whirling and/or buckling, optical images may be output. It will be appreciated that a variety of optical sources are useful with the systems and methods disclosed herein including, but are not limited to, laser optical sources, light emitting diodes, etc. Optical sources may include multiple wavelength sources or single wavelength sources. Use of multiple wavelength sources may be useful for generation of full color images.

Optionally, fiber scanning systems may include one or more optical components to facilitate optical coupling of an optical source to an optical fiber, such as lenses, prisms, filters, etc. Optionally, one or more optical components may be optically coupled to the optical fiber to facilitate outputting an image by the fiber scanning system, such as a lens, filter, or other element, optionally positioned in optical communication with a distal fiber end of the optical fiber.

The invention may be further understood by reference to the following non-limiting example.

Fiber Scanning System with Buckling Piezo Actuator

Figure 9:
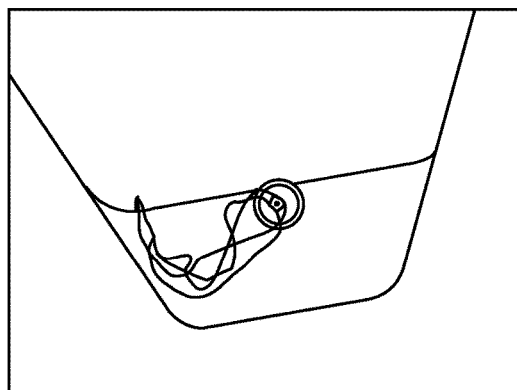
FIG. 9 provides optical images of a fiber scanning system embodiment.
Figure 9:
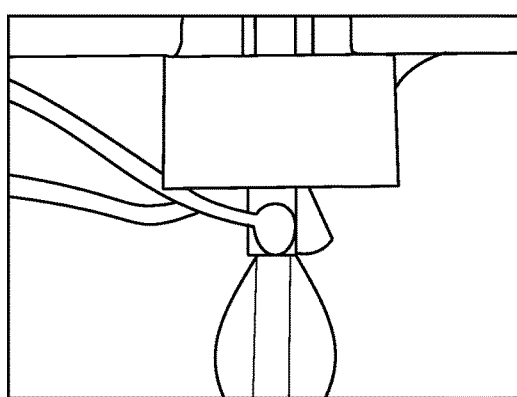
Figure 9:
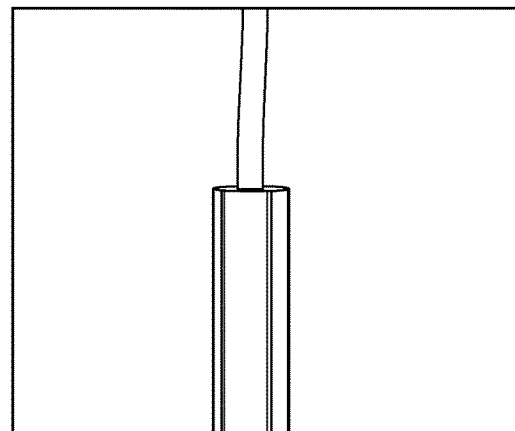
Figure 9:
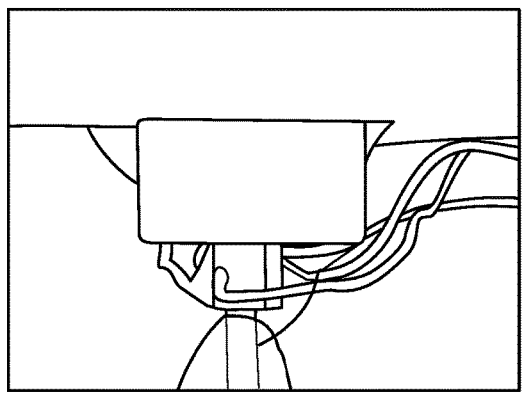
Figure 9:
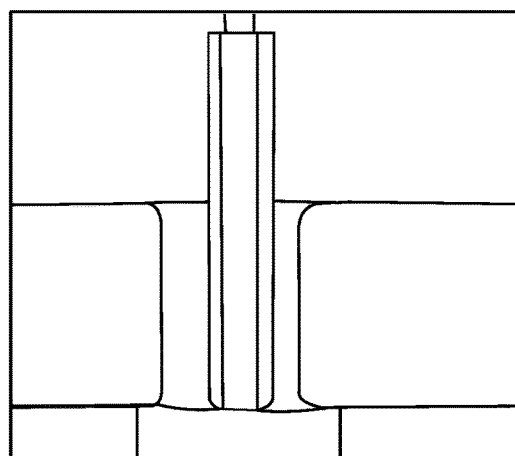

An optical fiber scanning system, similar to that shown in FIG. 7, was constructed as follows. An optical fiber of about 125 μm diameter was inserted into a 4-electrode radially poled piezo tube. The optical fiber had a cantilever length between the distal end of the piezo tube and the distal end of the optical fiber of about 2.5 mm. The optical fiber was fixed to a proximal buckling joint on a proximal end of the piezo tube. The piezo tube had a length of about 2.4 mm from the distal end to the proximal buckling position. Sinusoidal voltages of increasing amplitude were applied to each of the electrodes, phase shifted by 90 degrees to induce an oscillatory whirling motion. Triangular voltages were applied to all electrodes as an offset to each of the sinusoidal voltages to induce a change in the overall length of the piezo tube for buckling motion. Photographs of the constructed optical fiber scanner system are provided in FIG. 9, showing (clockwise from top) an overhead view, an upper side view, a middle side view, a lower side view, and an alternate lower side view.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to explain the principles of the invention and its practical applications to thereby enable others skilled in the art to utilize the invention in various embodiments and with various modifications as are suited to the particular use contemplated.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "1 alone, 2 alone, 3 alone, both 1 and 2, both 1 and 3, both 2 and 3, or all of 1, 2 and 3".

Every formulation or combination of components described or exemplified can be used to practice the invention, unless otherwise stated. Specific names of materials are intended to be exemplary, as it is known that one of ordinary skill in the art can name the same material differently. One of ordinary skill in the art will appreciate that methods, device elements, and starting materials, other than those specifically exemplified can be employed in the practice of the invention without resort to undue experimentation. All art-known functional equivalents, of any such methods, device elements, and starting materials, are intended to be included in this invention. Whenever a range is given in the specification, for example, a temperature range, a time range, a frequency range, or a composition range, all intermediate ranges and subranges, as well as all individual values included in the ranges given are intended to be included in the disclosure. All or portions of different embodiments described herein may be combined in any suitable manner without departing from the spirit and scope of the invention. However, other embodiments of the invention may be directed to specific embodiments relating to each individual aspect, or specific combinations of these individual aspects.

What is claimed is:

1. A system comprising:
    an optical fiber having a distal fiber end and a proximal fiber end;
    an electromechanical transducer mechanically coupled to the optical fiber between the distal fiber end and the proximal fiber end; and
    a voltage source in electrical communication with the electromechanical transducer, the voltage source configured to apply a plurality of voltages to the electromechanical transducer to vary an orientation of the distal fiber end of the optical fiber according to a spiral path, wherein the plurality of voltages includes a first voltage having a sinusoidal profile with an amplitude that increases or decreases as a function of time, and a second voltage that periodically ramps in magnitude.

2. The system of claim 1, wherein the distal fiber end is unconstrained.

3. The system of claim 1, wherein increasing or decreasing of the amplitude of the first voltage and ramping of the magnitude of the second voltage are synchronized with respect to one another.

4. The system of claim 1, wherein a frequency associated with increasing or decreasing the amplitude of the first voltage is about equal to a repetition frequency of the second voltage.

5. The system of claim 1, wherein a sinusoidal frequency of the first voltage is greater than a repetition frequency of the second voltage.

6. The system of claim 1, wherein application of the second voltage by the voltage source results in a change in overall length of the electromechanical transducer between a distal end of the electromechanical transducer and a proximal end of the electromechanical transducer.

7. The system of claim 1, wherein the electromechanical transducer is mechanically coupled to the optical fiber by a first joint at a distal end of the electromechanical transducer and by second joint at a proximal end of the electromechanical transducer.

8. The system of claim 7, wherein application of the second voltage by the voltage source buckles the optical fiber between the first joint and the second joint.

9. The system of claim 7, wherein application of the second voltage by the voltage source increases a pointing angle of the distal fiber end of the optical fiber beyond that of the distal fiber end of the optical fiber in an absence of the second voltage.

10. The system of claim 1, wherein the electromechanical transducer comprises a piezo tube and wherein the optical fiber passes through the piezo tube along a longitudinal axis of the piezo tube.

11. The system of claim 1, wherein the plurality of voltages are superimposed on one another.

12. The system of claim 1, wherein the electromechanical transducer comprises a first electromechanical transducer and a second electromechanical transducer, wherein the first electromechanical transducer is mechanically coupled to the optical fiber by a first joint, wherein the second electromechanical transducer is mechanically coupled to the optical fiber by a second joint, wherein the first joint is positioned between the second joint and the distal fiber end, and wherein the second joint is positioned between the first joint and the proximal fiber end.

13. The system of claim 12, wherein application of the second voltage by the voltage source buckles the optical fiber between the first joint and the second joint.

14. The system of claim 12, wherein the first electromechanical transducer includes a hub, a frame surrounding the hub, and a plurality of lateral electromechanical transducers mechanically coupled to the frame and to the hub, wherein the optical fiber passes through the hub, and wherein the hub is mechanically coupled to the optical fiber by the first joint.

15. The system of claim 12, wherein the first electromechanical transducer comprises a first piezo tube, wherein the first joint is positioned at a distal end of the first piezo tube, wherein the second electromechanical transducer comprises a second piezo tube, wherein the second joint is positioned at a distal end of the second piezo tube, and wherein the optical fiber passes through the first piezo tube and the second piezo tube along longitudinal axes of the first piezo tube and the second piezo tube.

16. The system of claim 15, further comprising a support tube, wherein the second piezo tube is positioned within the support tube, wherein a distal end of the support tube is mechanically coupled to a proximal end of the first piezo tube, and wherein a proximal end of the support tube is mechanically coupled to a proximal end of the second piezo tube.

17. The system of claim 1, wherein the proximal fiber end is coupled to an optical source for transmitting electromagnetic radiation generated by the optical source through the optical fiber from the proximal fiber end to the distal fiber end.

18. A method comprising:
applying a plurality of voltages to an electromechanical transducer of an optical fiber scanning system to vary an orientation of a distal fiber end of an optical fiber according to a spiral path, wherein the optical fiber scanning system includes:
the optical fiber, wherein the optical fiber has the distal fiber end and a proximal fiber end;
the electromechanical transducer, wherein the electromechanical transducer is mechanically coupled to the optical fiber between the distal fiber end and the proximal fiber end; and
a voltage source in electrical communication with the electromechanical transducer for applying the plurality of voltages;
wherein the plurality of voltages includes a first voltage having a sinusoidal profile with an amplitude that increases or decreases as a function of time, and a second voltage that periodically ramps in magnitude.

19. The method of claim 18, wherein the electromechanical transducer is mechanically coupled to the optical fiber by a first joint at a distal end of the electromechanical transducer and by second joint at a proximal end of the electromechanical transducer.

20. The method of claim 18, wherein the electromechanical transducer comprises a first electromechanical transducer and a second electromechanical transducer, wherein the first electromechanical transducer is mechanically coupled to the optical fiber by a first joint, wherein the second electromechanical transducer is mechanically coupled to the optical fiber by a second joint, wherein the first joint is positioned between the second joint and the distal fiber end, and wherein the second joint is positioned between the first joint and the proximal fiber end.

* * * * *